US011335403B2

(12) United States Patent
Robustelli

(10) Patent No.: US 11,335,403 B2
(45) Date of Patent: May 17, 2022

(54) TECHNIQUES FOR PROGRAMMING MULTI-LEVEL SELF-SELECTING MEMORY CELL

(71) Applicant: Micron Technology, Inc., Boise, ID (US)

(72) Inventor: Mattia Robustelli, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/983,486

(22) Filed: Aug. 3, 2020

(65) Prior Publication Data
US 2021/0020243 A1 Jan. 21, 2021

Related U.S. Application Data

(62) Division of application No. 16/001,798, filed on Jun. 6, 2018, now Pat. No. 10,755,781.

(51) Int. Cl.
*G11C 13/00* (2006.01)
*G11C 11/402* (2006.01)
(Continued)

(52) U.S. Cl.
CPC ...... *G11C 13/0069* (2013.01); *G11C 11/4026* (2013.01); *G11C 11/4074* (2013.01);
(Continued)

(58) Field of Classification Search
None
See application file for complete search history.

(56) References Cited

U.S. PATENT DOCUMENTS 8,077,505 B2 12/2011 Chen et al.
8,125,818 B2 2/2012 Muraoka et al.
(Continued)

FOREIGN PATENT DOCUMENTS

JP 2007-018681 A 1/2007
JP 2009-193626 A 8/2009
(Continued)

OTHER PUBLICATIONS

Taiwan Intellectual Property Office, "Office Action," issued in connection with ROC (Taiwan) Patent Application No. 109144996, dated Jun. 24, 2021 (5 pages).
(Continued)

*Primary Examiner* — J. H. Hur
(74) *Attorney, Agent, or Firm* — Holland & Hart LLP

(57) ABSTRACT

Techniques are provided for programming a multi-level self-selecting memory cell that includes a chalcogenide material. To program one or more intermediate memory states to the self-selecting memory cell, a programming pulse sequence that includes two pulses may be used. A first pulse of the programming pulse sequence may have a first polarity and a first magnitude and the second pulse of the programming pulse sequence may have a second polarity different than the first polarity and a second magnitude different than the first magnitude. After applying both pulses in the programming pulse sequence, the self-selecting memory cell may store an intermediate state that represents two bits of data (e.g., a logic '01' or a logic '10').

20 Claims, 9 Drawing Sheets

(51) Int. Cl.
*G11C 11/4074* (2006.01)
*G11C 11/56* (2006.01)

(52) U.S. Cl.
CPC ...... *G11C 11/5678* (2013.01); *G11C 13/0004* (2013.01); *G11C 13/0007* (2013.01); *G11C 2013/0078* (2013.01); *G11C 2013/0092* (2013.01)

(56) References Cited

U.S. PATENT DOCUMENTS

| | | | |
|---|---|---|---|
| 8,866,121 | B2 | 10/2014 | Wang et al. |
| 9,117,519 | B2 | 8/2015 | Spessot et al. |
| 9,183,929 | B2 | 11/2015 | Fantini et al. |
| 9,697,913 | B1 | 7/2017 | Mariani et al. |
| 9,799,381 | B1 | 10/2017 | Tortorelli et al. |
| 9,990,990 | B2 | 6/2018 | Fantini et al. |
| 2007/0008769 | A1 | 1/2007 | Kim et al. |
| 2008/0089111 | A1 | 4/2008 | Lee et al. |
| 2008/0232163 | A1 | 9/2008 | Dover |
| 2008/0296553 | A1 | 12/2008 | Philipp et al. |
| 2009/0134431 | A1 | 5/2009 | Tabata et al. |
| 2009/0154222 | A1 | 6/2009 | Chien et al. |
| 2010/0118595 | A1 | 5/2010 | Bae et al. |
| 2010/0149856 | A1 | 6/2010 | Tang |
| 2011/0089393 | A1 | 4/2011 | Chang et al. |
| 2013/0058164 | A1 | 3/2013 | Moschiano et al. |
| 2013/0295719 | A1* | 11/2013 | Lee ............... H01L 45/1608 438/104 |
| 2014/0003130 | A1 | 1/2014 | Ichihara et al. |
| 2014/0133213 | A1 | 5/2014 | Liu et al. |
| 2016/0012890 | A1 | 1/2016 | Park et al. |
| 2016/0284403 | A1 | 9/2016 | Navon et al. |
| 2017/0125097 | A1 | 5/2017 | Tortorelli et al. |
| 2017/0133090 | A1 | 5/2017 | Li et al. |
| 2018/0040370 | A1 | 2/2018 | Tortorelli et al. |
| 2018/0122468 | A1 | 5/2018 | Pirovano et al. |

FOREIGN PATENT DOCUMENTS

| | | |
|---|---|---|
| JP | 2017-527941 A | 9/2017 |
| JP | 2019-502224 A | 1/2019 |
| JP | 2019-532453 A | 11/2019 |
| WO | 2012127718 A1 | 9/2012 |
| WO | 2016/011638 A1 | 1/2016 |
| WO | 2017/078988 A1 | 5/2017 |
| WO | 2018/031217 A1 | 2/2018 |

OTHER PUBLICATIONS

ISA/KR, International Search Report of the International Searching Authority, Int'l. Appl. No. PCT/US2019/032441, Sep. 3, 2019, Korean Intellectual Property Office, Seo-gu, Daejeon, Republic of Korea, 10pgs.
U.S. Appl. No. 15/842,496, filed Dec. 14, 2017.
U.S. Appl. No. 15/842,504, filed Dec. 14, 2017.
Korean Intellectual Property Office, "Notice of Reasons for Rejection," issued in connection with Korean Patent Application No. 10-2020-7037967, dated Oct. 30, 2021 (6 pages).
Taiwan Intellectual Property Office, "Office Action," issued in connection with ROC (Taiwan) Patent Application No. 109144996, dated Nov. 30, 2021 (4 pages).
European Patent Office, "Extended Search Report," issued in connection with European Patent Application No. 9815476.7, dated Feb. 3, 2022 (11 pages).
Notice of Rejection Ground received for Japanese Patent Application No. 2020-567953, dated Feb. 22, 2022, 24 pages (14 pages of English Translation and 10 pages of Original Document).

* cited by examiner

TECHNIQUES FOR PROGRAMMING MULTI-LEVEL SELF-SELECTING MEMORY CELL

CROSS REFERENCE

The present application for Patent is a divisional of U.S. patent application Ser. No. 16/001,798 by Robustelli, entitled "TECHNIQUES FOR PROGRAMMING MULTI-LEVEL SELF-SELECTING MEMORY CELL," filed Jun. 6, 2018, assigned to the assignee hereof, and is expressly incorporated by reference in its entirety herein.

BACKGROUND

The following relates generally to operating a memory array and more specifically to programming a multi-level self-selecting memory device.

Memory devices are widely used to store information in various electronic devices such as computers, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. Storing multiple bits of information in a memory cell may be desired to increase a data storage density without increasing a physical memory cell density.

DETAILED DESCRIPTION

Figure 1:
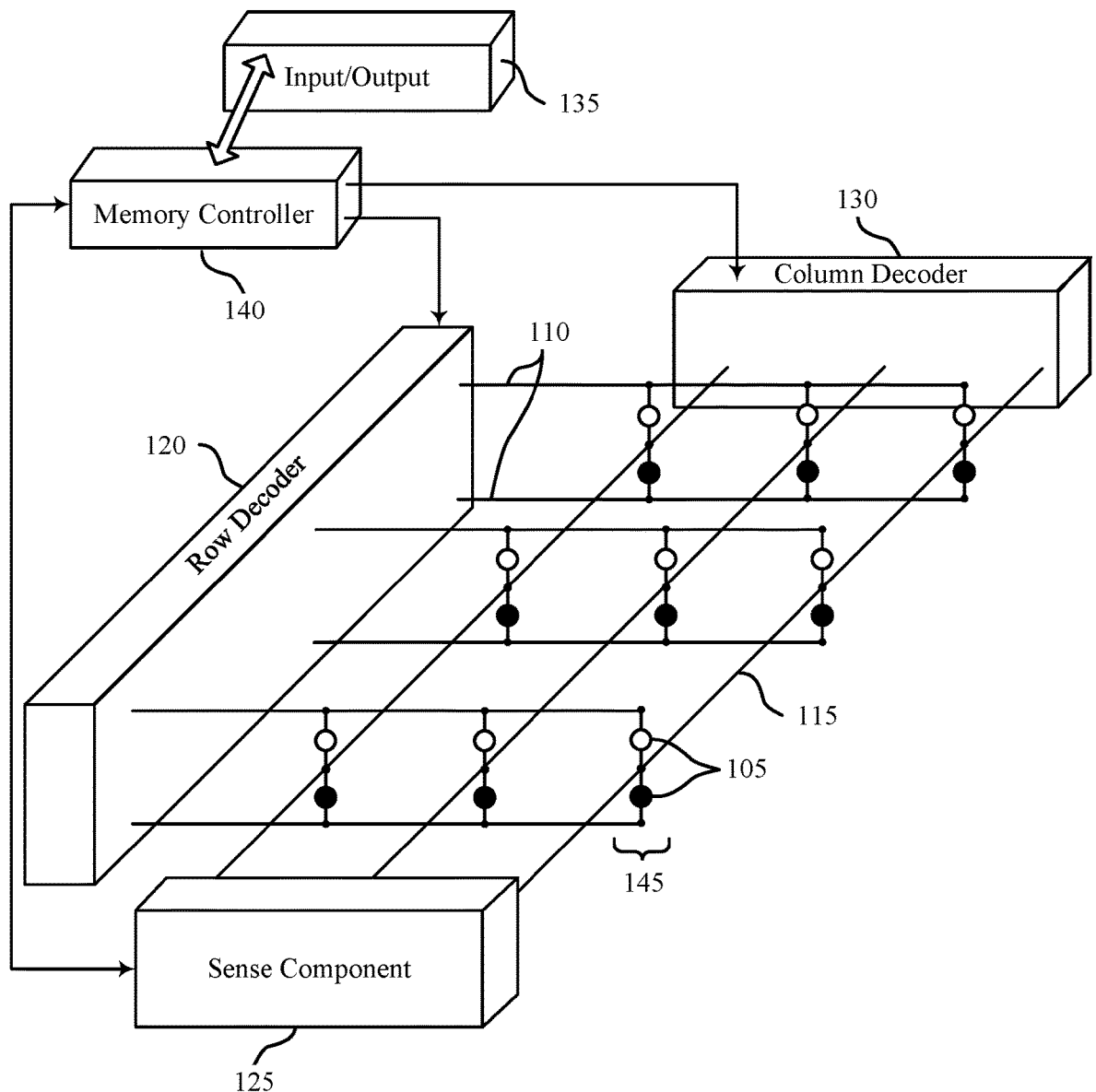
FIG. 1 illustrates an example memory device in accordance with embodiments of the present disclosure.

A self-selecting memory cell including a chalcogenide material may be an example of a multi-level cell that is configured to store three or more unique states. As such, a single multi-level self-selecting memory cell may be configured to store more than one bit of data. In some cases, a self-selecting memory cell may be selected by applying a certain bias between a word line and a digit line. The logic state that is stored in a self-selecting memory cell may be based on a polarity of a programming pulse applied to the self-selecting memory cell. For example, a self-selecting memory may store a logic '0' upon application of a programming pulse having a positive polarity and the self-selecting memory may store a logic '1' upon application of a programming pulse having a negative polarity.

Techniques are provided for programming a multi-level self-selecting memory cell that includes a chalcogenide material. To program one or more intermediate memory states to the self-selecting memory cell, a programming pulse sequence that includes two pulses may be used. A first pulse of the programming pulse sequence may have a first polarity and a first magnitude and the second pulse of the programming pulse sequence may have a second polarity different than the first polarity and a second magnitude different than the first magnitude. After applying both pulses in the programming pulse sequence, the self-selecting memory cell may store an intermediate state that represents two bits of data (e.g., a logic '01' or a logic '10').

In some cases, a memory controller may identify a first logic state to be programmed to the self-selecting memory cell. In one example, the first logic state may be an intermediate logic state (such as 01 or 10). Upon identifying the first logic state, the memory controller may select a first programming pulse for programming the self-selecting memory cell. In some cases, the memory controller may determine multiple parameters associated with the first programming pulse. In one example, the first programming pulse may have a first polarity and a first amplitude. In some cases, the first polarity may be a positive polarity or a negative polarity. The memory controller may then apply the first programming pulse to the self-selecting memory cell to program the self-selecting memory cell with a second logic state. The second logic state is different than the first logic state. For example, the second logic state may be an intermediate logic state for the self-selecting memory cell. After applying the first programming pulse, the memory controller may apply a second programming pulse with a second polarity and a second amplitude, to the self-selecting memory cell. The second polarity may be different than the first polarity. In one example, if the first polarity is a positive polarity, then the second polarity is a negative polarity. The application of the second programming pulse may program the self-selecting memory cell with the first logic state. The memory controller may then store the first logic state in the self-selecting memory cell. Aspects of the present disclosure may advantageously use two short pulses instead of a long pulse thereby conserving current and improving the performance of the self-selecting memory cell.

In one embodiment, the memory controller may replace at least one of the programming pulses with a sequence of programming pulses including a verify. In some cases, the verify may be a read voltage corresponding to a desired logic state for at least one bit. For example, the described state may be an intermediate logic state (such as 01 or 10). In some examples, each programming pulse in the sequence of programming pulses may be associated with a predetermined energy level. In some cases, the energy level associated with each programming pulse may increase iteratively. In some examples, the memory controller may determine a desired logic state to be programmed to the self-selecting memory cell. The memory controller may then apply a first programming pulse from the sequence of programming pulses and may perform a read operation after application of the first programming pulse. If the desired logic state is not achieved, then the memory controller may apply a second programming pulse from the sequence of programming pulses. In some cases, an energy level of the second programming pulse may be greater than an energy level of the first programming pulse. In some cases, the memory controller may perform a read operation after application of the second programming pulse to determine whether the desired logic state is achieved. If the desired logic state is achieved, the memory controller may stop the operation. Aspects of the present disclosure may advantageously result in a more accurate bit placement (i.e., a tighter distribution), if the bit voltage vs pulse energy has a high sensitivity.

In an alternative embodiment, the memory controller may identify a desired logic state for a self-selecting memory cell. For example, the desired logic state may be an intermediate logic state. In some cases, the memory controller may identify a current logic state of the self-selecting memory cell. For example, the memory controller may perform a read operation to identify the current logic state. In some cases, the memory controller may select a programming pulse based on the desired logic state and the current logic state. For example, the memory controller may determine a polarity of the programming pulse, an amplitude of the programming pulse, an energy of the programming pulse, a duration of the programming pulse, a shape of the programming pulse, or a combination thereof. The memory controller may then apply the programming pulse to the self-selecting memory cell to program the self-selecting memory cell with the desired logic state. In some cases, the memory controller may store the desired logic state in the self-selecting memory cell based on applying the programming pulse.

In this alternative embodiment, the memory controller may determine a programming pulse to apply to the self-selecting memory cell based on the desired logic state and the current logic state. In some cases, the memory controller may be configured to replace the determined programming pulse with a sequence of programming pulses including a verify. As previously discussed, each programming pulse in the sequence of programming pulses may be associated with an energy level which may increase iteratively. In some examples, the memory controller may apply a first programming pulse from the sequence of programming pulses and may perform a read operation to determine whether the self-selecting memory cell has been programmed with the desired logic state. If the desired logic state is not achieved, then the memory controller may apply a second programming pulse from the sequence of programming pulses. In some cases, the second programming pulse may be configured to have a higher energy level than the first programming pulse.

Features of the disclosure introduced above are further described below in the context of memory array with a cross-point architecture. Specific examples are then described for operating the memory array related to techniques to access a self-selecting memory device in some embodiments. These and other features of the disclosure are further illustrated by and described with reference to apparatus diagrams, system diagrams, and flowcharts that relate to techniques to program a self-selecting memory device.

FIG. 1 illustrates an example memory device 100 in accordance with embodiments of the present disclosure. Memory device 100 may also be referred to as an electronic memory apparatus. FIG. 1 is an illustrative representation of various components and features of the memory device 100. As such, it should be appreciated that the components and features of the memory device 100 shown to illustrate functional interrelationships, not their actual physical positions within the memory device 100. In the illustrative example of FIG. 1, the memory device 100 includes a three-dimensional (3D) memory array. The 3D memory array includes memory cells 105 that may be programmable to store different states. In some embodiments, each memory cell 105 may be programmable to store two states, denoted as a logic 0 and a logic 1. In some embodiments, a memory cell 105 may be configured to store more than two logic states. A memory cell 105 may, in some embodiments, include a self-selecting memory cell. Although some elements included in FIG. 1 are labeled with a numeric indicator, other corresponding elements are not labeled, though they are the same or would be understood to be similar, in an effort to increase visibility and clarity of the depicted features.

The 3D memory array may include two or more two-dimensional (2D) memory arrays formed on top of one another. This may increase a number of memory cells that may be placed or created on a single die or substrate as compared with 2D arrays, which in turn may reduce production costs, or increase the performance of the memory device, or both. Based on the example depicted in FIG. 1, memory array includes two levels of memory cells 105 and may thus be considered a 3D memory array; however, the number of levels is not limited to two. Each level may be aligned or positioned so that memory cells 105 may be aligned (exactly, overlapping, or approximately) with one another across each level, forming a memory cell stack 145. In some cases, the memory cell stack 145 may include multiple self-selecting memory cells laid on top of another while sharing an access line for both as explained below. In some cases, the self-selecting memory cells may be multi-level self-selecting memory cells configured to store more than one bit of data using multi-level storage techniques.

In some embodiments, each row of memory cells 105 is connected to an access line 110, and each column of memory cells 105 is connected to a bit line 115. Access lines 110 and bit lines 115 may be substantially perpendicular to one another and may create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third layer may share a access line 110 with a lower layer. In general, one memory cell 105 may be located at the intersection of two conductive lines such as a access line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized in order to read or write a memory cell 105 at their intersection. Other memory cells 105 that are in electronic communication with (e.g., connected to) the same access line 110 or bit line 115 may be referred to as untargeted memory cells 105.

As discussed above, electrodes may be coupled to a memory cell 105 and an access line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some embodiments, a memory cell 105 may include a chalcogenide material positioned between a first electrode and a second electrode. One side of the first electrode may be coupled to an access line 110 and the other side of the first electrode to the chalcogenide material. In addition, one side of the second electrode may be coupled to a bit line 115 and the other side of the second electrode to the chalcogenide material. The first electrode and the second electrode may be the same material (e.g., carbon) or different.

Operations such as reading and writing may be performed on memory cells 105 by activating or selecting access line 110 and digit line 115. In some embodiments, access lines 110 may also be known as word lines 110, and bit lines 115 may also be known digit lines 115. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate digit line 115. Thus, by activating a word line 110 and a digit line 115, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. An ordinary person skilled in the art would appreciate that sense component may be associated either with column decoder or row decoder without losing its functional purposes.

A memory cell 105 may be set or written by similarly activating the relevant word line 110 and digit line 115 and at least one logic value may be stored in the memory cell 105. Column decoder 130 or row decoder 120 may accept data, for example input/output 135, to be written to the memory cells 105. In the case of a self-selecting memory cell including a chalcogenide material, a memory cell 105 may be written to store data by applying a programming sequence including a first pulse having a first polarity and a second pulse having a second polarity. The programming pulse may have various shapes. This process is discussed in more detail below with reference to FIGS. 3A, 3B, 4A, 4B, 5A and 5B.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory device 100.

The memory controller 140 may be configured to execute a write operation that can program a self-selecting memory cell with more than two states. For example, the memory controller 140 may be configured to program the self-selecting memory cell with four states (e.g., a logic '00', a logic '01', a logic '10', or a logic '11'). In some cases, a programming pulse sequence for storing an intermediate state in the self-selecting memory cell may include two pulses. A first pulse may have a first polarity and a second pulse may have a second polarity opposite the first polarity. In some cases, the magnitude of the second pulse may be less than a magnitude of the first pulse.

For example, the memory controller 140 may identify a first logic state for the self-selecting memory cell. The memory controller 140 may then apply a first programming pulse with a first polarity and a first amplitude to the self-selecting memory cell to program the self-selecting memory cell with a second logic state different than the first logic state. For example, the memory controller 140 may apply the first programming pulse to program the self-selecting memory cell with an intermediate logic state. The memory controller 140 may then apply a second pulse with a second polarity different than the first polarity and a second amplitude, to the self-selecting memory cell to program the self-selecting memory cell with the first logic state. The memory controller 140 may then store the first logic state in the self-selecting memory cell.

In some embodiments, the memory controller 140 may identify a desired logic state for a self-selecting memory cell. As described herein, the self-selecting memory cell is configured to store more than two logic states. The memory controller 140 may identify a current logic state of the self-selecting memory cell. For example, the memory controller 140 may perform a read operation to identify the current logic state. In some cases, the memory controller 140 may select a programming pulse based on the desired logic state and the current logic state, and apply the programming pulse to the self-selecting memory cell. In some cases, the memory controller 140 may store the desired logic state in the self-selecting memory cell based on applying the programming pulse.

Figure 2:
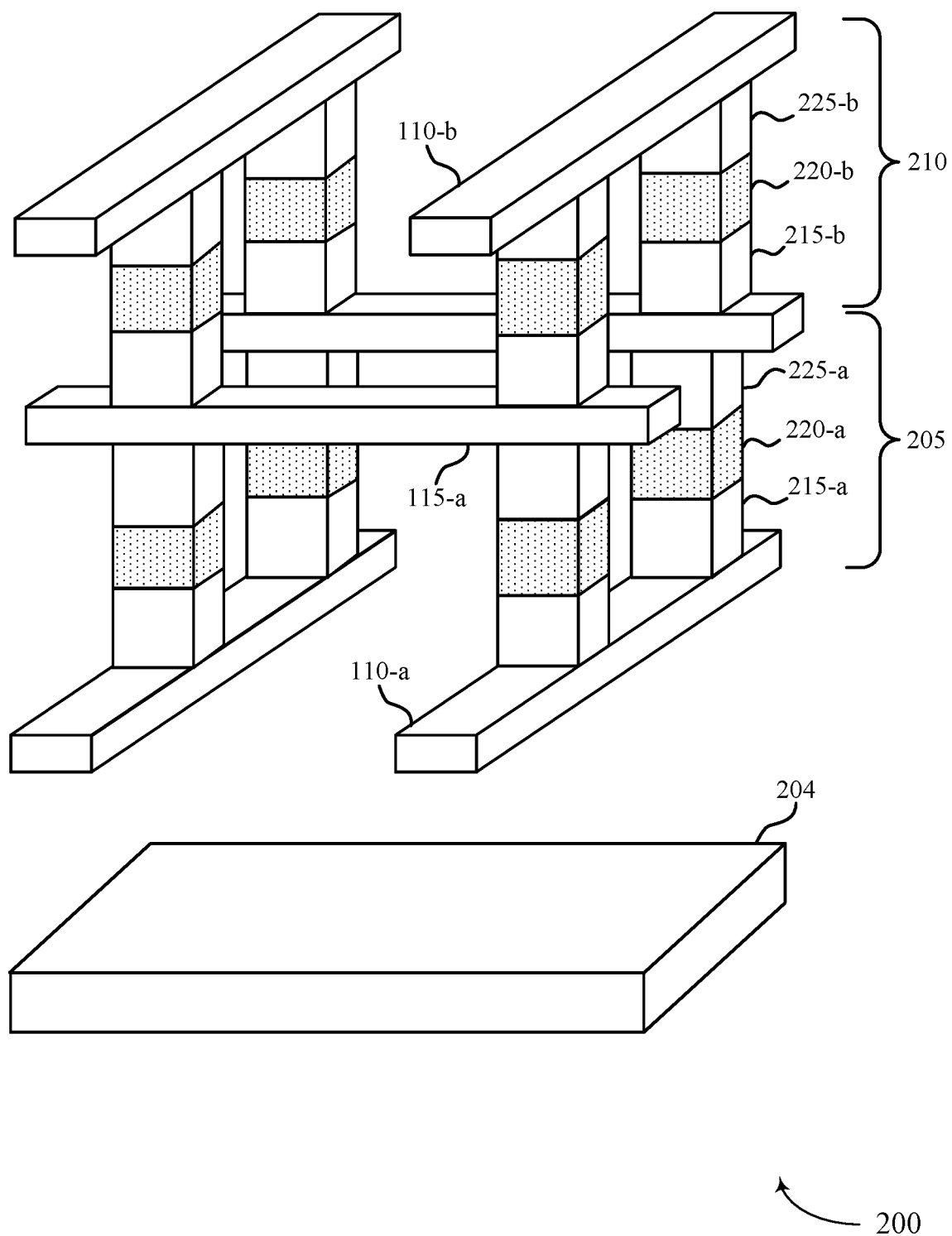
FIG. 2 illustrates an example of a memory array that supports programming a multi-level self-selecting memory device in accordance with aspects of the present disclosure.

FIG. 2 illustrates an example of a 3D memory array 200 that supports programming a multi-level self-selecting memory device in accordance with embodiments of the present disclosure. Memory array 200 may be an example of portions of memory array described with reference to FIG. 1. Memory array 200 may include a first array or deck 205 of memory cells that is positioned above a substrate 204 and second array or deck 210 of memory cells on top of the first array or deck 205. Memory array 200 may also include word line 110-*a* and word line 110-*b*, and bit line 115-*a*, which may be examples of word line 110 and bit line 115, as described with reference to FIG. 1. Memory cells of the first deck 205 and the second deck 210 each may have one or more self-selecting memory cell. Although some elements included in FIG. 2 are labeled with a numeric indicator, other corresponding elements are not labeled, though they are the same or would be understood to be similar, in an effort to increase visibility and clarity of the depicted features.

Self-selecting memory cells of the first deck 205 may include first electrode 215-*a*, chalcogenide material 220-*a*, and second electrode 225-*a*. In addition, self-selecting memory cells of the second deck 210 may include a first electrode 215-*b*, chalcogenide material 220-*b*, and second electrode 225-*b*. The self-selecting memory cells of the first deck 205 and second deck 210 may, in some embodiments, have common conductive lines such that corresponding self-selecting memory cells of each deck 205 and 210 may share bit lines 115 or word lines 110 as described with reference to FIG. 1. For example, first electrode 215-*b* of the second deck 210 and the second electrode 225-*a* of the first deck 205 may be coupled to bit line 115-*a* such that bit line 115-*a* is shared by vertically adjacent self-selecting memory cells.

The architecture of memory array 200 may be referred to as a cross-point architecture in which a memory cell is formed at a topological cross-point between a word line and a bit line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selection component. For example, DRAM may use a transistor, which is a three-terminal device, as the selection component for each memory cell and may have a larger memory cell area compared to the cross-point architecture.

In some architectures (not shown), a plurality of word lines may be formed on parallel planes or tiers parallel to a substrate. The plurality of word lines may be configured to include a plurality of holes to allow a plurality of bit lines formed orthogonally to the planes of word lines such that each of the plurality of bit lines penetrates through a vertically aligned set of holes (e.g., the bit lines vertically disposed with respect to the planes of word lines and the horizontal substrate). Memory cells including storage element (e.g., self-selecting memory cells including a chalcogenide material) may be formed at the crossings of word lines and bit lines (e.g., spaces between the word lines and the bit line in the vertically aligned set of holes). In a similar fashion as described above with reference to FIG. 1, the memory cells (e.g., self-selecting memory cells including a chalcogenide material) may be operated (e.g., read and/or programmed) by selecting respective access lines (e.g., a bit line and a word line) and applying voltage or current pulses.

While the example of FIG. 2 shows two memory decks, other configurations are possible. In some embodiments, a single memory deck of self-selecting memory cells may be constructed above a substrate 204, which may be referred to as a two-dimensional memory. In some embodiments, a three or four memory decks of memory cells may be configured in a similar manner in a three-dimensional cross point architecture. In some embodiments, one or more of the memory decks may include self-selecting memory cells that include chalcogenide material 220. Chalcogenide material 220 may, for example, include a chalcogenide glass such as, for example, an alloy of selenium (Se), tellurium (Te), arsenic (As), antimony (Sb), carbon (C), germanium (Ge), and silicon (Si). In some embodiment, a chalcogenide material having primarily selenium (Se), arsenic (As), and germanium (Ge) may be referred to as SAG-alloy. In some embodiments, SAG-alloy may include silicon (Si) and such chalcogenide material may be referred to as SiSAG-alloy. In some embodiments, the chalcogenide glass may include additional elements such as hydrogen (H), oxygen (O), nitrogen (N), chlorine (Cl), or fluorine (F), each in atomic or molecular forms.

In some embodiments, a self-selecting memory cell including chalcogenide material 220 may be programmed to a logic state by applying a programming pulse to the self-selecting memory cell using a bit line 115 and a word line 110. In one example, a controller associated with a self-selecting memory cell may identify a first logic state for the self-selecting memory cell. First, a first programming pulse with a first polarity and a first amplitude may be applied to the self-selecting memory cell to program the self-selecting memory cell with a second logic state different than the first logic state. Second, a second pulse with a second polarity different than the first polarity and a second amplitude, may be applied to the self-selecting memory cell to program the self-selecting memory cell with the first logic state. Once the second pulse is applied, the first logic state may be stored in the self-selecting memory cell.

Figure 3A:
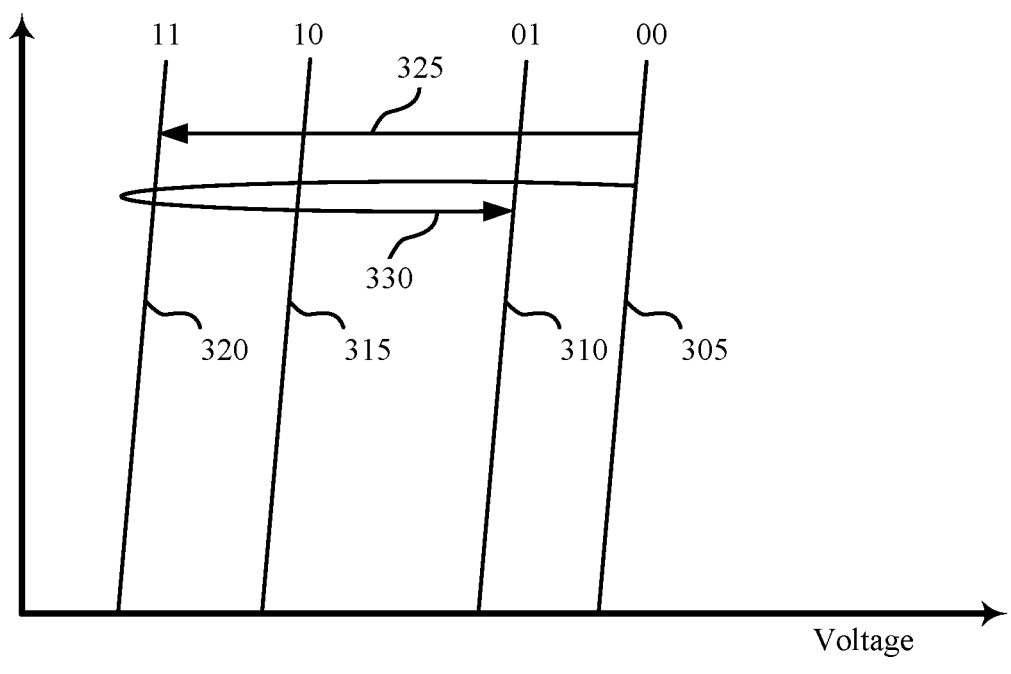
FIG. 3A illustrates an example of a diagram showing distributions of threshold voltages in a self-selecting memory cell that supports programming a multi-level self-selecting memory device in accordance with aspects of the present disclosure.

FIG. 3A illustrates an example of a diagram 300 showing distributions of threshold voltages of a self-selecting memory cell in accordance with embodiments of the present disclosure. A multi-level self-selecting memory cell may be configured to store a logic state that represents multiple bits of data using a multi-level storage techniques. The voltage distributions depict logic states that may be stored in a self-selecting memory cell.

Self-selecting memory cells may include a chalcogenide material as described with reference to FIGS. 1 and 2. The threshold voltage distributions may represent a multi-level cell programming scheme for storing at least two-bits per cell. In the example of FIG. 3A, the distribution 305 may represent a logic state 00, the distribution 310 may represent a logic state 01, the distribution 315 may represent a logic state 10, and the distribution 320 may represent a logic state 11. In some cases, the distributions 305, 310, 315, and 320 may exhibit a median voltage value (such as a normal quantile) corresponding to a voltage distribution for each logic state. For example, the distribution 305 may represent a normal quantile for a distribution corresponding to logic state 00. Similarly, the distribution 310 may represent a normal quantile for a distribution corresponding to logic state 01, the distribution 315 may represent a normal quantile for a distribution corresponding to logic state 10, and the distribution 320 may represent a normal quantile for a distribution corresponding to logic state 11. In some embodiments, two distributions may have an overlapping portion, thus may not have clear separation between the two distributions. In some embodiments, each distribution may not be symmetrical around its median. In some embodiments, each distribution may exhibit a different ranges of voltage values.

Figure 3B:
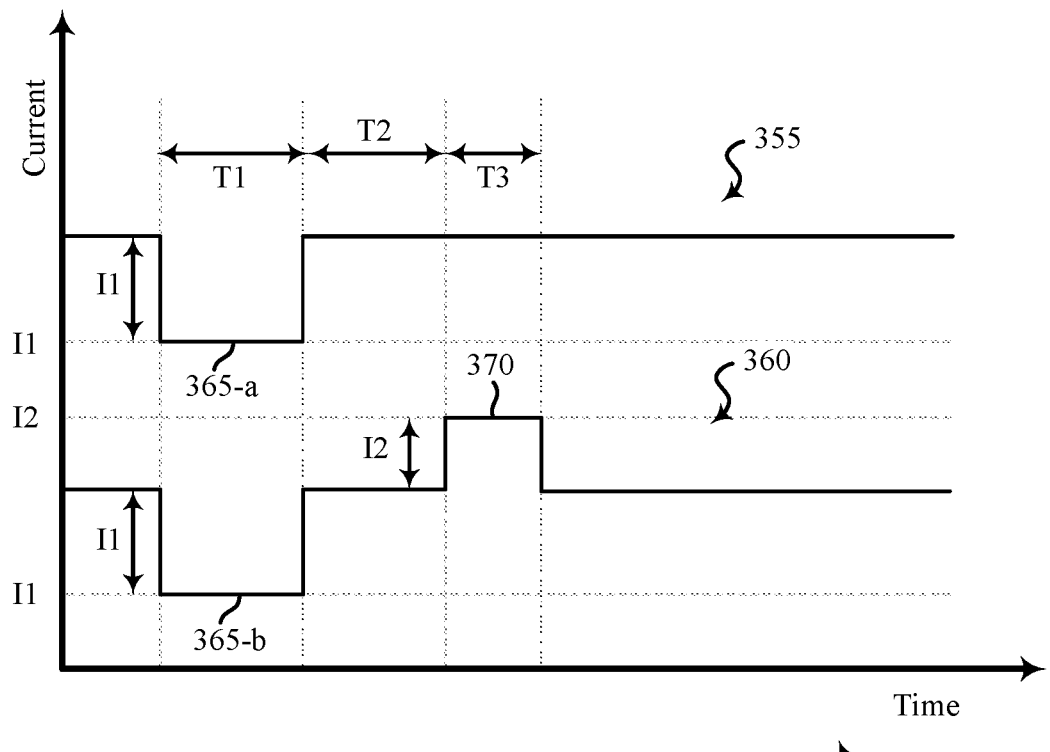
FIG. 3B illustrates an example of a timing diagram that supports programming a multi-level self-selecting memory device in accordance with aspects of the present disclosure.

FIG. 3B illustrates an example of a timing diagram 350 for a write operation that supports programming a multi-level self-selecting memory device in accordance with various embodiments of the present disclosure. The timing diagram 350 shows a first pulse sequence 355 for programming a logic state '11' (e.g., distribution 320) and a second pulse sequence 360 for programming an intermediate logic state '01' (e.g., distribution 310). The pulse sequences 355, 360 may be used to program a multi-level self-selecting memory cell. In particular, the second pulse sequence 360 may be configured to store an intermediate state in the self-selecting memory device. The diagram 350 plots a magnitude of a voltage of one or more pulses (y-axis) applied to the self-selecting memory cells with respect to time (x-axis). In some cases, the voltage applied during programming a self-selecting memory cell may not correlate with an energy associated with a programming pulse. As a result, the voltage may be selected in a manner such that the voltage is sufficient to select the self-selecting memory cell regardless of a current state of the self-selecting memory cell. In some cases, the energy associated with a programming pulse may be increased if a default bias is not enough to select a high voltage associated with a self-selecting memory cell. In some examples, once a self-selecting memory cell is turned on, a bias across the active material of the self-selecting memory cell may be smaller than an external bias. In such cases, the bias may depend on one or more properties of the active material. As a result, controlling the pulse energy at a given pulse duration, may be controlled by a current flowing through the self-selecting memory cell. The current flowing through the self-selecting memory cell may be controlled using static configurations or dynamic configurations. In some cases, the current flowing in the self-selecting memory cell may be controlled using clamp devices or current mirrors.

A self-selecting memory cell with a chalcogenide material may be programmed with a first logic state upon receiving the first pulse sequence 355. The first pulse sequence 355 may include a pulse 365-$a$ with an amplitude corresponding to $I_1$ and a first polarity. The pulse 365-$a$ may be applied for a duration $T_1$ during which a fixed amplitude corresponding to $I_1$ is maintained. In some embodiments, the duration $T_1$ may range between few nano-seconds (nsec) up to a micro-second (μsec) long, e.g., 10 nsec to 1 μsec. The self-selecting memory cell may be programmed with a logic state 11 upon receiving the pulse 365-$a$. Using the first pulse sequence, regardless of the current state of the memory cell, the new state of the memory cell will be the logic state associated with the distribution 320. Arrow 325 of FIG. 3A shows the self-selecting memory cell going from the distribution 305 to the distribution 320 based on receiving the first pulse 365-$a$ during a write operation. In other examples, the pulse 365-$a$ will cause the self-selecting memory cell to go from the distribution 310 or the distribution 315 to the distribution 320.

The second pulse sequence 360 may be configured to program the self-selecting memory cell with an intermediate logic state with a threshold voltage distribution that lies between two other threshold voltage distributions. The second pulse sequence 360 may include the first pulse 365-$b$ and a second pulse 370. The first pulse 365-$b$ may be similar in amplitude and polarity to pulse 365-$a$. The second pulse 370 may be configured to move the self-selecting memory cell from the distribution 320 to the distribution 310. The second pulse 370 may be a square pulse having a second polarity and a time duration $T_3$ during which a fixed amplitude corresponding to $I_2$ is maintained. In some cases, the second polarity of the second pulse 370 is different than the first polarity of the first pulse 365-$b$. This difference in polarity may cause the threshold voltage distribution of the self-selecting memory cell to move in a different direction than when the first pulse 365-$b$ is applied.

In some cases, write operation for multi-level memory cells may exhibit large latencies because of detecting characteristics of the memory cell or finely tuning pulses applied to the memory cell. The second pulse sequence 360 is configured to provide a relative fast write operation for an intermediate level of the self-selected memory cell. In the second pulse sequence 360, the first pulse 365-$b$ may be configured to move the self-selecting memory cell to an extreme distribution (e.g., distribution 320). Once there, the memory controller may have confidence in the current state of the self-selecting memory cell and apply the second pulse 370 to move the self-selecting memory cell to the desired intermediate distribution (e.g., distribution 310). Such a pulse sequence may avoid having a plurality of different pulse sequences for every combination of current state and desired state of the self-selecting memory cell.

As shown in the timing diagram 350, the first pulse 365-$b$ may be applied for the first duration $T_1$ and the second pulse 370 may be applied sometime after the first pulse 365-$b$ for a duration $T_3$. Arrow 330 of FIG. 3A shows the self-selecting memory cell going from the distribution 305 to the distribution 320 based on receiving the first pulse 365-$b$ during a write operation and then going from the distribution 320 to the distribution 310 based on receiving the second pulse 370 during the write operation. In other examples, the pulse 365-$b$ will cause the self-selecting memory cell to go from the distribution 310 or the distribution 315 to the distribution 320. The duration $T_3$ may occur after the duration $T_1$. In some cases, the pulse sequence 360 may include a gap time where the self-selecting memory cell may be biased to a zero voltage level or a ground voltage, during a duration $T_2$. The gap time may occur between the duration $T_1$ and the duration $T_3$. In some examples, there is no gap time between applying the first pulse 365-b and the second pulse 370. In such cases, the second pulse 370 may be applied immediately after the first voltage pulse is applied.

Although the pulses are depicted in the diagram 350 as square pulses, it should be appreciated that various shapes of programming pulses may be applied to self-selecting memory devices without losing functionality. For example, programming pulses may be square pulses, rectangular pulses, ramp pulses, or a combination thereof.

In some examples, the second pulse sequence 360 may be replaced by a sequence of programming pulses including a verify. As previously described, the verify may be a read voltage corresponding to a desired logic state for at least one bit. In the example of FIGS. 3A and 3B, the desired state may be at an intermediate logic state of 01. In some cases, the sequence of programming pulses may include a plurality of programming pulses, each associated with an energy level. To achieve the intermediate logic state of 01, a first programming pulse from the sequence of programming pulses may be applied. A read operation may be performed to verify whether a current state of the self-selecting memory cell corresponds to the intermediate logic state of 01. In some cases, the read operation may be a non-destructive read operation. In such cases, to verify whether a current state of the self-selecting memory cell is between the intermediate logic state of 10 and the intermediate logic state of 01, the read operation may non-destructively assess that a threshold voltage is higher than the respective logic state. In some cases, the read operation may be selected based at least in part on a desired logic state. If the desired logic state (i.e., 01) is not achieved, then a second programming pulse from the sequence of programming pulses may be applied. The second programming pulse may be configured to have a higher energy level than the first programming pulse. After the application of the second programming pulse, a second read operation may be performed to verify whether the desired logic state is achieved. In some cases, one or more parameters associated with the first read operation may be different from one or more parameters associated with the second read operation. If the desired logic state (i.e., the intermediate logic state of 01) is achieved, then no further programming pulses are applied. In some cases, using a program-verify operation may increase the likelihood of accurate bit placement, but it may reduce other parameters (e.g., latency and/or power consumption).

Figure 4A:
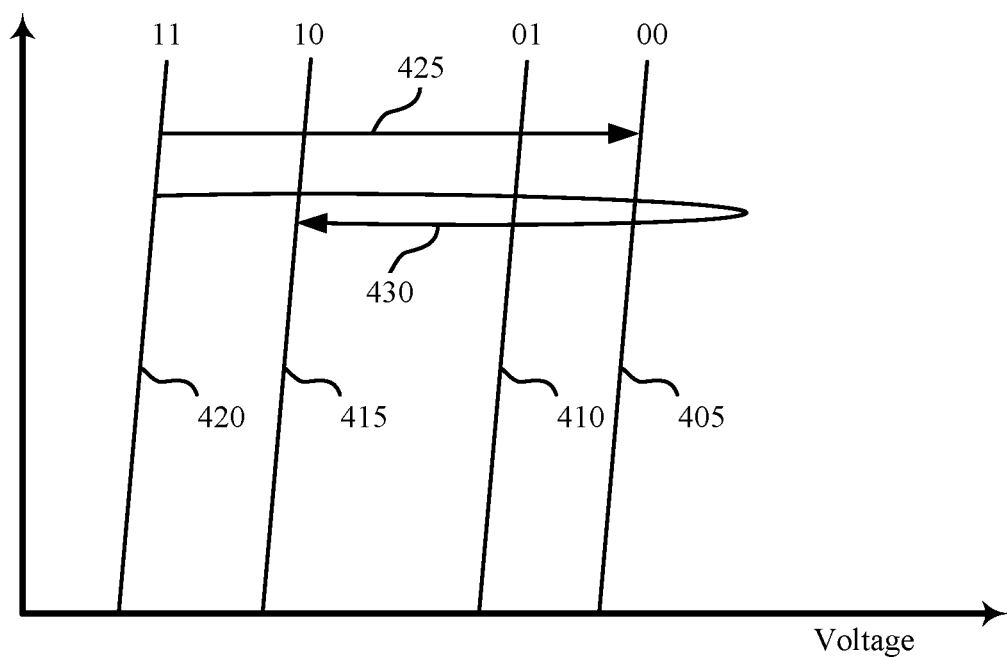
FIG. 4A illustrate an example of a diagram showing distributions of threshold voltages in a self-selecting memory cell that supports programming a multi-level self-selecting memory device in accordance with aspects of the present disclosure.

FIG. 4A illustrates an example of a diagram 400 showing distributions of threshold voltages of a self-selecting memory cell in accordance with embodiments of the present disclosure. A multi-level self-selecting memory device cell is configured to store a logic state that represents multiple bits of data using a multi-level storage techniques. The voltage distributions depict logic states that may be stored in a self-selecting memory cell.

The voltage distributions may represent a multi-level cell programming scheme for storing at least two-bits per cell. For example, the distribution 405 may represent a logic state 00, the distribution 410 may represent a logic state 01, the distribution 415 may represent a logic state 10, and the distribution 420 may represent a logic state 11. Similar to the distributions 305, 310, 315, and 320, as discussed with reference to FIG. 3A, the distributions 405, 410, 415, and 420 may exhibit a median voltage value (such as a normal quantile) corresponding to a voltage distribution for each logic state. More specifically, the distribution 405 may represent a normal quantile for a distribution corresponding to logic state 00. Similarly, the distribution 410 may represent a normal quantile for a distribution corresponding to logic state 01, the distribution 415 may represent a normal quantile for a distribution corresponding to logic state 10, and the distribution 420 may represent a normal quantile for a distribution corresponding to logic state 11.

Figure 4B:
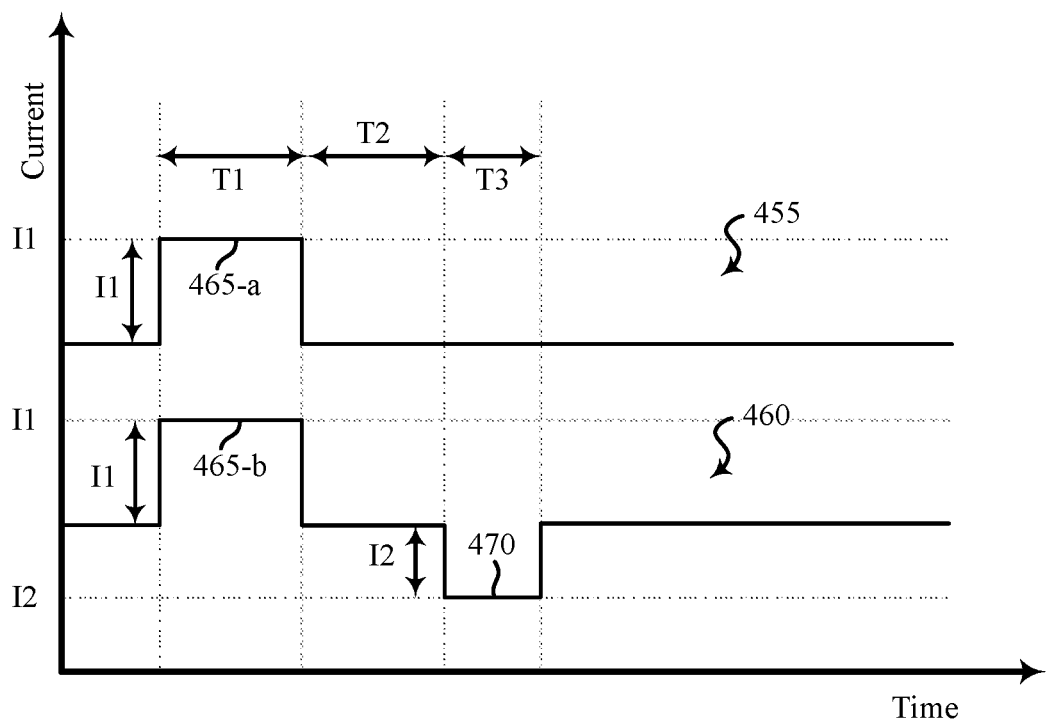
FIG. 4B illustrates an example of a timing diagram that supports programming a multi-level self-selecting memory device in accordance with aspects of the present disclosure.

FIG. 4B illustrates an example of a timing diagram 450 for a write operation that supports programming a multi-level self-selecting memory device in accordance with various embodiments of the present disclosure. The timing diagram 450 shows a first pulse sequence 455 for programming a logic state '11' (e.g., distribution 420) and a second pulse sequence 460 for programming an intermediate logic state '01' (e.g., distribution 410). The pulse sequences 455, 460 may be used to program a multi-level self-selecting memory cell. In particular, the second pulse sequence 460 may be configured to store an intermediate state in the self-selecting memory device. The diagram 450 plots a magnitude of a voltage of one or more pulses (y-axis) applied to the self-selecting memory cells with respect to time (x-axis).

The pulse sequences 355, 360, 455, and 460 may be used to write any of four states to a multi-level self-selecting memory cell. Each pulse sequence 355, 360, 455, or 460 may be dedicated to writing a specific state to the self-selecting memory cell. Pulse sequences 455, 460 may be similarly embodied as pulse sequences 355, 360 except the pulses of the pulse sequences 455, 460 may have the opposite polarity as the pulses in the pulse sequences 355, 360. For example, the polarity the first pulse 465 may be opposite of the polarity of the first pulse 365. This may occur because the pulses 365, 465 are configured to move the self-selecting memory cell to different extreme threshold voltages distributions.

A self-selecting memory cell with a chalcogenide material may be programmed with a first logic state upon receiving first pulse sequence 455. The first pulse sequence 455 may include a pulse 465-a with an amplitude corresponding to $I_1$ and a first polarity. The pulse 465-a may be applied for a duration $T_1$ during which a fixed amplitude corresponding to $I_1$ is maintained. In some embodiments, the duration $T_1$ may range between few nano-seconds (nsec) up to a microsecond (μsec) long, e.g., 10 nsec to 1 μsec. For example, the self-selecting memory cell may be programmed with a logic state 00 upon receiving the pulse 465-a with an amplitude corresponding to $I_1$ in a first polarity. Using the first pulse sequence 455, regardless of the current state of the memory cell, the new state of the memory cell will be the logic state associated with the distribution 405. Arrow 425 of FIG. 4A shows the self-selecting memory cell going from the distribution 420 to the distribution 405 based on receiving the first pulse 465-a during a write operation. In other examples, the pulse 465-a will cause the self-selecting memory cell to go from the distribution 410 or the distribution 415 to the distribution 405.

The second pulse sequence 460 may be configured to program the self-selecting memory cell with an intermediate logic state (such as logic state 10) with a threshold voltage distribution that lies between two other threshold voltage distributions. The second pulse sequence 360 may include the first pulse 465-b and a second pulse 470. The first pulse 465-b may be similar in amplitude and polarity to pulse 465-a. In some examples, the second pulse 470 may be configured to move the self-selecting memory cell from the distribution 320 to the distribution 310. The second pulse 470 may be a square pulse having a second polarity and a time duration T₃ during which a fixed level of amplitude corresponding to I₂ is maintained. In some cases, the second polarity is different than the first polarity of the first pulse 465-*b*. For example, the first pulse 465-*b* may have a positive polarity and the second pulse 470 may have a negative polarity.

As shown in the timing diagram 450, the first pulse 465-*b* may be applied for the first duration T₁ and the second pulse 470 may be applied sometime after the first pulse 465-*b* for a duration T₃. Arrow 430 of FIG. 4A shows the self-selecting memory cell going from the distribution 420 to the distribution 405 based on receiving the first pulse 465-*b* during a write operation and then going from the distribution 405 to the distribution 415 based on receiving the second pulse 470 during the write operation. In other examples, the pulse 465-*b* will cause the self-selecting memory cell to go from the distribution 410 or the distribution 415 to the distribution 405. The time duration T₃ may occur after the time duration T₁. In some cases, the pulse sequence 460 may include a gap time where the self-selecting memory cell may be biased to a zero voltage level or a ground voltage, during a duration T₂. The gap time may occur between the duration T₁ and the duration T₃. In some examples, there is no gap time between applying the first pulse 465-*b* and the second pulse 470. In such cases, the second pulse 470 may be applied immediately after the first voltage pulse is applied.

In some embodiments, the self-selecting memory cell may be at a logic state 00 upon receiving the first pulse 465-*b*, and upon receiving the second pulse 470, the self-selecting memory cell may be programmed with a logic state 10. Although the pulses are depicted in the diagram 450 as square pulses, it should be appreciated that various shapes of programming pulses may be applied to self-selecting memory devices without losing functionality. For example, programming pulses may be square pulses, rectangular pulses, ramp pulses, or a combination thereof.

When performing a multi-level write operation for a multi-level self-selecting memory cell, a controller (e.g., memory controller 140) may identify the new logic state being written to the memory cell. The controller may select a programming sequence (e.g., programming pulse sequences 355, 360, 455, 460) based on identifying the logic state. In some cases, the controller may identify that the new logic state to be written to the memory cell is an intermediate state (e.g., other distributions are on either side of the intermediate state). If the new logic state is an intermediate state, the controller may select a programming sequence that includes two pulses (e.g., programming pulse sequence 360 or 460). The controller may determine one or more parameters associated with the selected programming sequence. The parameters of the programming sequences may include a number of pulses, a polarity of one or more of the pulses, an amplitude of one or more of the pulses, an energy of one or more of the pulses, a duration of one or more of the pulses, a shape of one or more of the pulses, or a combination thereof.

In some examples, the second pulse sequence 460 may be replaced by a sequence of programming pulses including a verify (not shown) to achieve the desired logic state corresponding to 10. As previously described with reference to FIGS. 3A and 3B, the sequence of programming pulses may include a plurality of programming pulses, each associated with a different energy level. In some cases, a series of programming pulses may be applied until the intermediate logic state is achieved, and a read operation is performed after application of each programming pulse to verify whether the data was stored correctly. In such cases, an energy level associated with a first programming pulse may be lower than an energy level associated with a second programming pulse.

Figure 5A:
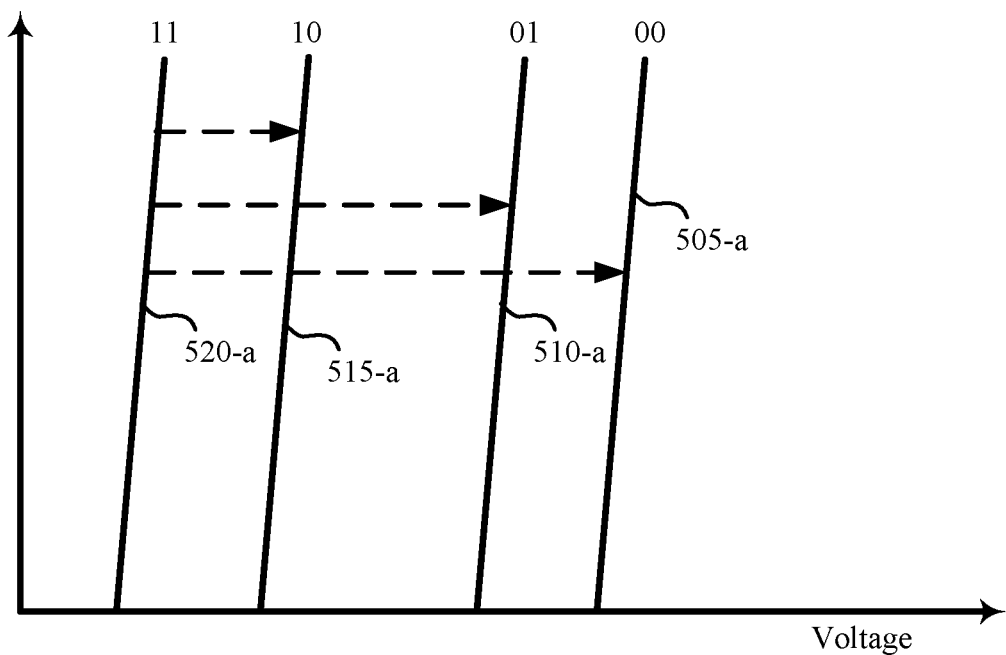
FIG. 5A illustrates an example of a diagram showing distributions of threshold voltages in a self-selecting memory cell that supports programming a multi-level self-selecting memory device in accordance with aspects of the present disclosure.
Figure 5B:
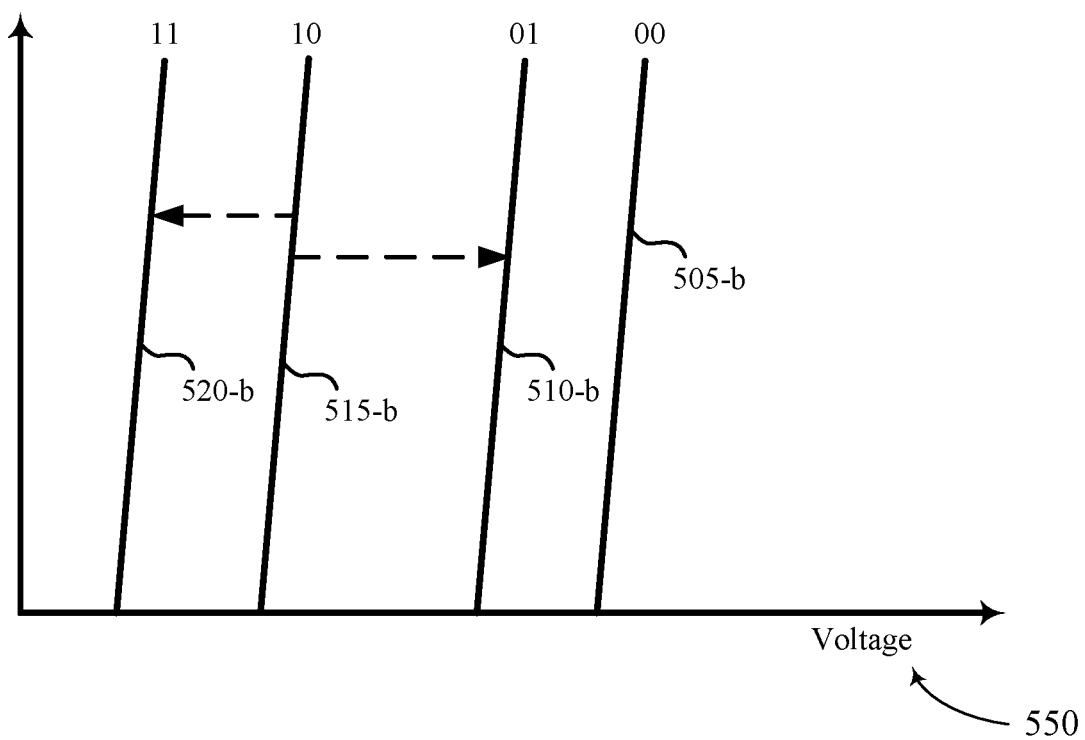
FIG. 5B illustrates an example of a diagram showing distributions of threshold voltages in a self-selecting memory cell that supports programming a multi-level self-selecting memory device in accordance with aspects of the present disclosure.

FIGS. 5A and 5B illustrate examples diagrams 500 and 550 showing distributions of threshold voltages of a self-selecting memory cell in accordance with embodiments of the present disclosure. Although the electrical pulses are not shown, it may be appreciated that a series of electrical pulses may be applied to program a multi-level self-selecting memory device. In the example of FIG. 5A, a multi-level self-selecting memory device cell configured to store multiple logic states is described.

The diagrams 500 and 550 depict logic states in a self-selecting memory cell. For example, the distribution 505-*a* may represent a logic state 00, the distribution 510-*a* may represent a logic state 01, the distribution 515-*a* may represent a logic state 10, and the distribution 520-*a* may represent a logic state 11. Similar to the distributions 305, 310, 315, and 320 and the distributions 405, 410, 415, and 420, as discussed with reference to FIGS. 3A and 4A, the distributions 505-*a*, 510-*a*, 515-*a*, and 520-*a* may exhibit a median voltage value (such as a normal quantile) corresponding to a voltage distribution for each logic state.

A controller (e.g., memory controller 140) of a self-selecting memory device may determine a desired logic state for the self-selecting memory cell and a current logic state for the self-selecting memory cell. Upon identifying the current logic state, the self-selecting memory cell may determine an appropriate pulse to apply. In one example, the current logic state for the self-selecting memory cell may be 11 and a desired logic state for the self-selecting memory cell may be 10. In such a case, the controller may identify parameters related to a programming sequence, which when applied, will store the desired logic state in the self-selecting memory cell. In some examples, the parameters of the programming sequence may include a number of pulses, a polarity of one or more of the pulses, an amplitude of one or more of the pulses, an energy of one or more of the pulses, a duration of one or more of the pulses, a shape of one or more of the pulses, or a combination thereof. In the example where the current logic state for the self-selecting memory cell is 11 and the desired logic state for the self-selecting memory cell is 10, the pulse may be of a positive polarity. Additionally or alternatively, the self-selecting memory cell may be configured to identify other desired logic states (such as 01 or 00) and may determine parameters related to the pulse. Although not explicitly described, it may be understood that in one example, the current logic state for the self-selecting memory cell may be 00 and a desired logic state for the self-selecting memory cell may be 01, 10, or 11.

In the example of FIG. 5B, the diagram 550 shows how pulses may change the state stored on the self-selecting memory cell from an intermediate state to some other state. In some embodiments, a controller may determine a desired logic state for the self-selecting memory cell and a current logic state for the self-selecting memory cell. In some cases, the self-selecting memory cell may perform a read operation to determine the desired logic state. Upon identifying the current logic state, the controller may determine an appropriate pulse to apply. In the example of FIG. 5B, the current logic state for the self-selecting memory cell is 10 and a desired logic state for the self-selecting memory cell may be 11 or 01. In a case when the desired logic state for the self-selecting memory cell is 11, the self-selecting memory cell may identify a pulse with a negative polarity. On the other hand, when the desired logic state for the self-selecting memory cell is 01, the self-selecting memory cell may identify a pulse with a positive polarity. Further, the memory controller may determine amplitudes of the different pulses based on the current state and the desired state of the self-selecting memory cell. Additionally or alternatively, the self-selecting memory cell may be configured to identify other current logic states (such as 01) and other corresponding desired logic states (such as 10 or 00). Based on the current logic state and the desired logic state, the self-selecting memory cell may determine parameters related to a pulse for application to the self-selecting memory cell.

In some cases, the controller may determine the appropriate pulse to apply to the self-selecting memory cell based on the desired logic state and the current logic state. In some cases, the controller may replace the determined programming pulse with a sequence of programming pulses as described with reference to FIGS. 3A, 3B, 4A, and 4B. The controller may apply the sequence of programming pulses iteratively until the desired logic state is achieved (e.g., a program-verify scheme). As previously described, each programming pulse in the sequence of programming pulses may be associated with a different energy level.

Figure 6:
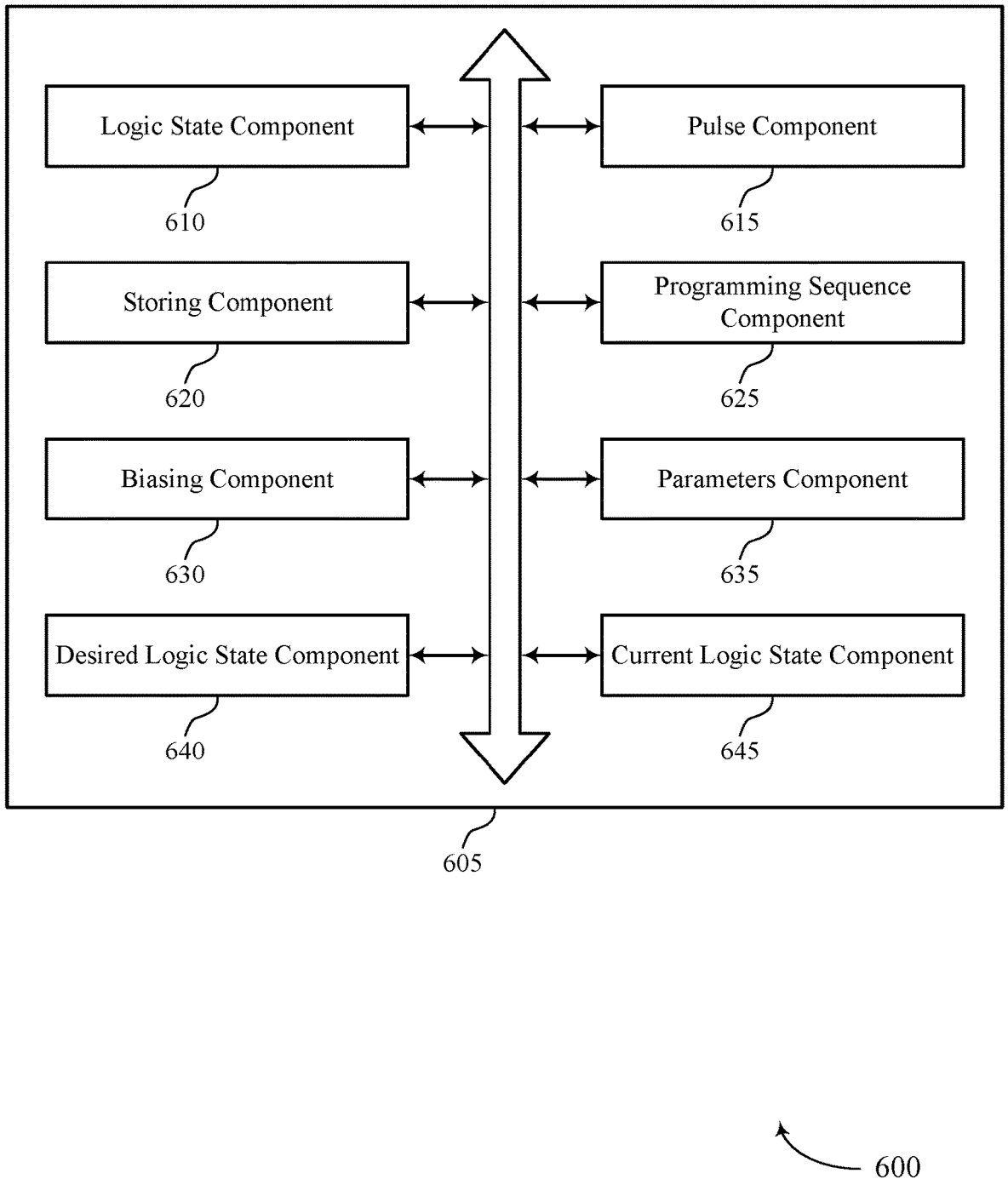
FIG. 6 shows a block diagram of a device that supports programming a multi-level self-selecting memory device in accordance with aspects of the present disclosure.

FIG. 6 shows a block diagram 600 of a memory controller 605 that supports programming a multi-level self-selecting memory device in accordance with aspects of the present disclosure. The memory controller 605 may be an example of aspects of a memory controller 140 described herein. The memory controller 605 may include a logic state component 610, a pulse component 615, a storing component 620, a programming sequence component 625, a biasing component 630, a parameters component 635, a desired logic state component 640, and a current logic state component 645. Each of these modules may communicate, directly or indirectly, with one another (e.g., via one or more buses).

The logic state component 610 may identify a first logic state for a self-selecting memory cell configured to store more than two logic states. In some examples, identifying that the first logic state includes an intermediate state of the self-selecting memory cell, where applying the second pulse is based on identifying that the first logic state includes the intermediate state. In some cases, the first logic state represents at least two bits of digital data. In some cases, a memory component of the self-selecting memory cell includes a tapered profile.

In some cases, the memory component of the self-selecting memory cell includes a bottom surface having a first surface area and a top surface having a second surface area positioned opposite the bottom surface, the first surface area being different than the second surface area. In some cases, the self-selecting memory cell includes a chalcogenide material.

The pulse component 615 may apply a first pulse with a first polarity and a first amplitude to the self-selecting memory cell to program the self-selecting memory cell with a second logic state different than the first logic state. In some examples, the pulse component 615 may apply a second pulse with a second polarity different than the first polarity and a second amplitude to the self-selecting memory cell to program the self-selecting memory cell with the first logic state.

In some examples, the pulse component 615 may select a programming pulse based on the desired logic state and the current logic state. In some examples, the pulse component 615 may apply the programming pulse to the self-selecting memory cell. In some examples, the pulse component 615 may select the second amplitude of the second pulse based on identifying the first logic state and the first amplitude of the first pulse, where applying the second pulse with the second polarity is based on selecting the second amplitude.

In some examples, the pulse component 615 may apply the first pulse to the self-selecting memory cell during a first time period. In some examples, the pulse component 615 may apply the second pulse to the self-selecting memory cell during a second time period, where at least a portion of the second time period occurs after the first time period. In some examples, the pulse component 615 may apply an integrated pulse to the self-selecting memory cell to program the self-selecting memory cell with the first logic state, where the integrated pulse includes the first pulse and the second pulse.

In some examples, the pulse component 615 may determine a first shape of the first pulse and a second shape of the second pulse based on identifying the first logic state, where storing the first logic state in the self-selecting memory cell is based on determining the first shape of the first pulse and the second shape of the second pulse.

In some examples, the pulse component 615 may apply the programming pulse with a selected polarity and a selected amplitude to the self-selecting memory cell to program the self-selecting memory cell with the desired logic state. In some cases, the first amplitude is greater than the second amplitude. In some cases, the first pulse or the second pulse is a square pulse, a rectangular pulse, a ramp pulse, or a combination thereof.

The storing component 620 may store the first logic state in the self-selecting memory cell based on applying the first pulse with the first polarity and the second pulse with the second polarity. In some examples, the storing component 620 may store the desired logic state in the self-selecting memory cell based on applying the programming pulse.

The desired logic state component 640 may identify a desired logic state for a self-selecting memory cell that is configured to store more than two logic states. In some cases, the desired logic state represents at least two bits of digital data. The current logic state component 645 may identify a current logic state of the self-selecting memory cell.

The programming sequence component 625 may select a programming sequence based on identifying the first logic state, where the programming sequence includes the first pulse and the second pulse, where storing the first logic state is based on selecting the programming sequence.

The biasing component 630 may bias the self-selecting memory cell to a zero voltage level during a third time period between the first time period and the second time period. In some examples, the biasing component 630 may bias, after applying the first pulse and before applying the second pulse, the self-selecting memory cell to a voltage level different than the first amplitude and the second amplitude. In some cases, the voltage level is a zero voltage level.

The parameters component 635 may determine one or more parameters associated with a programming sequence based on identifying the first logic state to store to the self-selecting memory cell, where storing the first logic state is based on determining the one or more parameters associated with the programming sequence. In some examples, the parameters component 635 may select one or more parameters associated with the programming pulse based on the desired logic state and the current logic state of the self-selecting memory cell, where applying the programming pulse to the self-selecting memory cell is based on selecting the one or more parameters associated with the programming pulse.

In some cases, the one or more parameters include a polarity of the first pulse, an amplitude of the first pulse, an energy of the first pulse, a duration of the first pulse, a shape of the first pulse, a polarity of the second pulse, an amplitude of the second pulse, an energy of the second pulse, a duration of the second pulse, a shape of the second pulse, a gap duration between applying the first pulse and applying the second pulse, an amplitude of a voltage applied during the gap duration, a polarity of the voltage applied during the gap duration, or a combination thereof.

Figure 7:
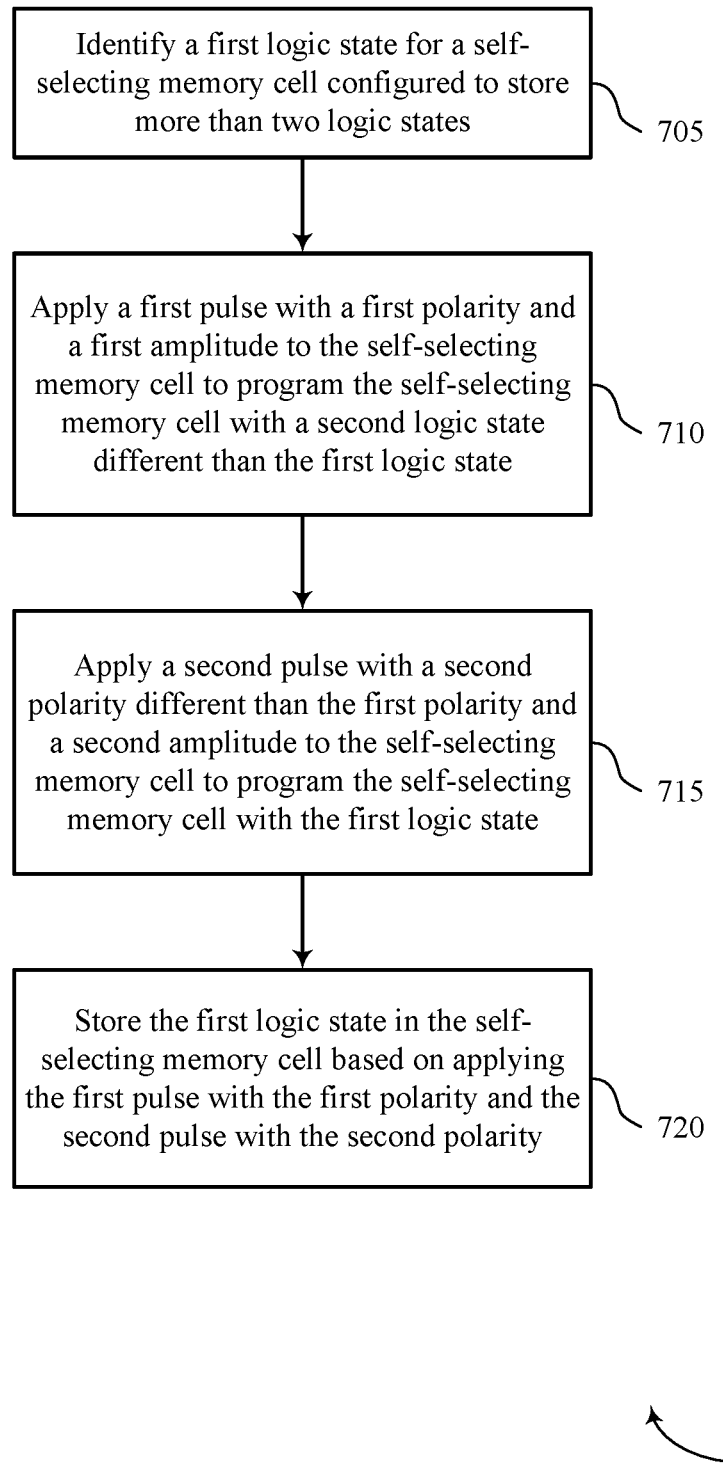
FIGS. 7 through 9 illustrate flowcharts of methods that support programming a multi-level self-selecting memory device in accordance with aspects of the present disclosure.

FIG. 7 shows a flowchart illustrating a method 700 that supports programming a multi-level self-selecting memory device in accordance with aspects of the present disclosure. The operations of method 700 may be implemented by a memory controller or its components as described herein. For example, the operations of method 700 may be performed by a memory controller 605 as described with reference to FIG. 6. In some examples, a memory controller may execute a set of instructions to control the functional elements of the memory controller to perform the functions described below. Additionally or alternatively, a memory controller may perform aspects of the functions described below using special-purpose hardware.

At 705, the memory controller may identify a first logic state for a self-selecting memory cell configured to store more than two logic states. The operations of 705 may be performed according to the methods described herein. In some examples, aspects of the operations of 705 may be performed by a logic state component 610 as described with reference to FIG. 8.

At 710, the memory controller may apply a first pulse with a first polarity and a first amplitude to the self-selecting memory cell to program the self-selecting memory cell with a second logic state different than the first logic state. The operations of 710 may be performed according to the methods described herein. In some examples, aspects of the operations of 710 may be performed by a pulse component 615 as described with reference to FIG. 6.

At 715, the memory controller may apply a second pulse with a second polarity different than the first polarity and a second amplitude to the self-selecting memory cell to program the self-selecting memory cell with the first logic state. The operations of 715 may be performed according to the methods described herein. In some examples, aspects of the operations of 715 may be performed by a pulse component 615 as described with reference to FIG. 6.

At 720, the memory controller may store the first logic state in the self-selecting memory cell based on applying the first pulse with the first polarity and the second pulse with the second polarity. The operations of 720 may be performed according to the methods described herein. In some examples, aspects of the operations of 720 may be performed by a storing component 620 as described with reference to FIG. 6.

An apparatus for performing the method 700 is described. The apparatus may include means for identifying a first logic state for a self-selecting memory cell configured to store more than two logic states, applying a first pulse with a first polarity and a first amplitude to the self-selecting memory cell to program the self-selecting memory cell with a second logic state different than the first logic state, applying a second pulse with a second polarity different than the first polarity and a second amplitude to the self-selecting memory cell to program the self-selecting memory cell with the first logic state, and storing the first logic state in the self-selecting memory cell based on applying the first pulse with the first polarity and the second pulse with the second polarity.

Some examples of the method and the apparatus described herein may further include operations, features, means, or instructions for identifying that the first logic state includes an intermediate state of the self-selecting memory cell, where applying the second pulse may be based on identifying that the first logic state includes the intermediate state.

Some examples of the method and the apparatus described herein may further include operations, features, means, or instructions for selecting a programming sequence based on identifying the first logic state, where the programming sequence includes the first pulse and the second pulse, where storing the first logic state may be based on selecting the programming sequence.

Some examples of the method and the apparatus described herein may further include operations, features, means, or instructions for selecting the second amplitude of the second pulse based on identifying the first logic state and the first amplitude of the first pulse, where applying the second pulse with the second polarity may be based on selecting the second amplitude.

In some examples of the method and the apparatus described herein, applying the first pulse may include operations, features, means, or instructions for applying the first pulse to the self-selecting memory cell during a first time period, and where applying the second pulse includes and applying the second pulse to the self-selecting memory cell during a second time period, where at least a portion of the second time period occurs after the first time period.

Some examples of the method and the apparatus described herein may further include operations, features, means, or instructions for biasing the self-selecting memory cell to a zero voltage level during a third time period between the first time period and the second time period.

Some examples of the method and the apparatus described herein may further include operations, features, means, or instructions for biasing, after applying the first pulse and before applying the second pulse, the self-selecting memory cell to a voltage level different than the first amplitude and the second amplitude. In some examples of the method and the apparatus described herein, the voltage level may be a zero voltage level.

Some examples of the method and the apparatus described herein may further include operations, features, means, or instructions for determining one or more parameters associated with a programming sequence based on identifying the first logic state to store to the self-selecting memory cell, where storing the first logic state may be based on determining the one or more parameters associated with the programming sequence.

In some examples of the method and the apparatus described herein, the one or more parameters include a polarity of the first pulse, an amplitude of the first pulse, an energy of the first pulse, a duration of the first pulse, a shape of the first pulse, a polarity of the second pulse, an amplitude of the second pulse, an energy of the second pulse, a duration of the second pulse, a shape of the second pulse, a gap duration between applying the first pulse and applying the second pulse, an amplitude of a voltage applied during the gap duration, a polarity of the voltage applied during the gap duration, or a combination thereof. In some examples of the method and the apparatus described herein, the first amplitude may be greater than the second amplitude.

Some examples of the method and the apparatus described herein may further include operations, features, means, or instructions for determining a first shape of the first pulse and a second shape of the second pulse based on identifying the first logic state, where storing the first logic state in the self-selecting memory cell may be based on determining the first shape of the first pulse and the second shape of the second pulse.

In some examples of the method and the apparatus described herein, the first pulse or the second pulse may be a square pulse, a rectangular pulse, a ramp pulse, or a combination thereof.

In some examples of the method and the apparatus described herein, the first logic state represents at least two bits of digital data. In some examples of the method and the apparatus described herein, a memory component of the self-selecting memory cell includes a tapered profile.

In some examples of the method and the apparatus described herein, the memory component of the self-selecting memory cell includes a bottom surface having a first surface area and a top surface having a second surface area positioned opposite the bottom surface, the first surface area being different than the second surface area. In some examples of the method and the apparatus described herein, the self-selecting memory cell includes a chalcogenide material.

Figure 8:
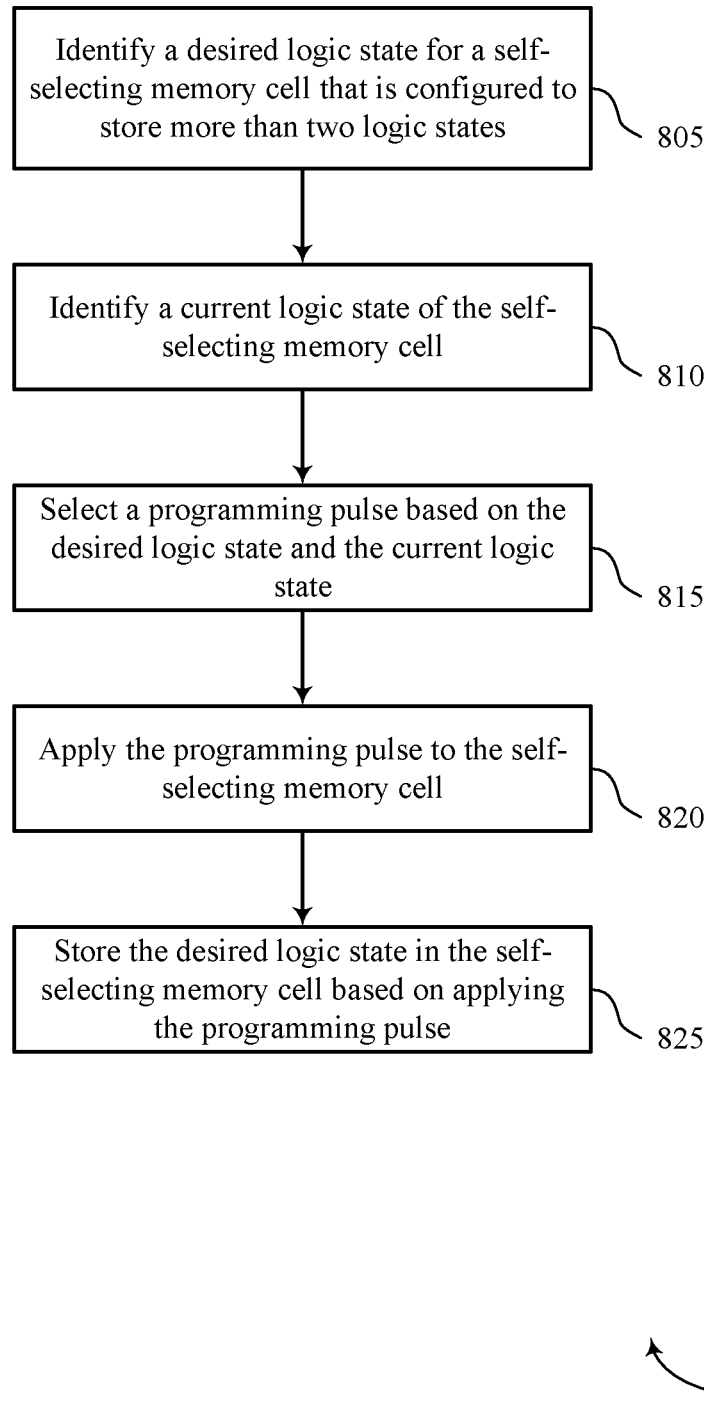

FIG. 8 shows a flowchart illustrating a method 800 that supports programming a multi-level self-selecting memory device in accordance with aspects of the present disclosure. The operations of method 800 may be implemented by a memory controller or its components as described herein. For example, the operations of method 800 may be performed by a memory controller 605 as described with reference to FIG. 6. In some examples, a memory controller may execute a set of instructions to control the functional elements of the memory controller to perform the functions described below. Additionally or alternatively, a memory controller may perform aspects of the functions described below using special-purpose hardware.

At 805, the memory controller may identify a desired logic state for a self-selecting memory cell that is configured to store more than two logic states. The operations of 805 may be performed according to the methods described herein. In some examples, aspects of the operations of 805 may be performed by a desired logic state component 640 as described with reference to FIG. 6.

At 810, the memory controller may identify a current logic state of the self-selecting memory cell. The operations of 810 may be performed according to the methods described herein. In some examples, aspects of the operations of 810 may be performed by a current logic state component 645 as described with reference to FIG. 6.

At 815, the memory controller may select a programming pulse based on the desired logic state and the current logic state. The operations of 815 may be performed according to the methods described herein. In some examples, aspects of the operations of 815 may be performed by a pulse component 615 as described with reference to FIG. 6.

At 820, the memory controller may apply the programming pulse to the self-selecting memory cell. The operations of 820 may be performed according to the methods described herein. In some examples, aspects of the operations of 820 may be performed by a pulse component 615 as described with reference to FIG. 6.

At 825, the memory controller may store the desired logic state in the self-selecting memory cell based on applying the programming pulse. The operations of 825 may be performed according to the methods described herein. In some examples, aspects of the operations of 825 may be performed by a storing component 620 as described with reference to FIG. 6.

An apparatus for performing the method 800 is described. The apparatus may include means for identifying a desired logic state for a self-selecting memory cell that is configured to store more than two logic states, identifying a current logic state of the self-selecting memory cell, selecting a programming pulse based on the desired logic state and the current logic state, applying the programming pulse to the self-selecting memory cell, and storing the desired logic state in the self-selecting memory cell based on applying the programming pulse.

Some examples of the method and the apparatus described herein may further include operations, features, means, or instructions for selecting one or more parameters associated with the programming pulse based on the desired logic state and the current logic state of the self-selecting memory cell, where applying the programming pulse to the self-selecting memory cell may be based on selecting the one or more parameters associated with the programming pulse.

In some examples of the method and the apparatus described herein, the one or more parameters includes a polarity of the programming pulse, an amplitude of the programming pulse, an energy of the programming pulse, a duration of the programming pulse, a shape of the programming pulse, or a combination thereof.

In some examples of the method and the apparatus described herein, applying the programming pulse to the self-selecting memory cell may include operations, features, means, or instructions for applying the programming pulse with a selected polarity and a selected amplitude to the self-selecting memory cell to program the self-selecting memory cell with the desired logic state.

In some examples of the method and the apparatus described herein, the desired logic state represents at least two bits of digital data.

Figure 9:
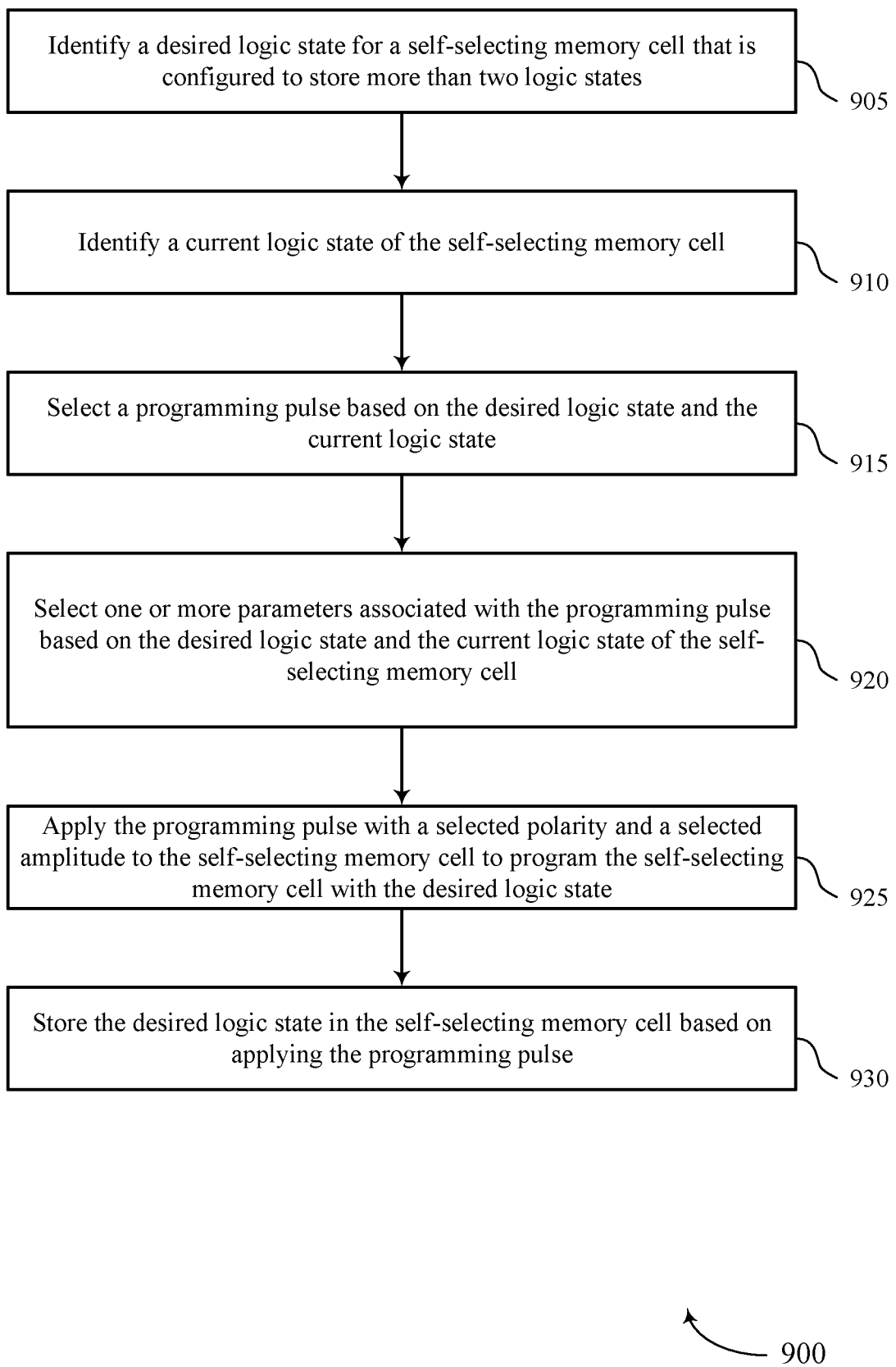

FIG. 9 shows a flowchart illustrating a method 900 that supports programming a multi-level self-selecting memory device in accordance with aspects of the present disclosure. The operations of method 900 may be implemented by a memory controller or its components as described herein. For example, the operations of method 900 may be performed by a memory controller 605 as described with reference to FIG. 6. In some examples, a memory controller may execute a set of instructions to control the functional elements of the memory controller to perform the functions described below. Additionally or alternatively, a memory controller may perform aspects of the functions described below using special-purpose hardware.

At 905, the memory controller may identify a desired logic state for a self-selecting memory cell that is configured to store more than two logic states. The operations of 905 may be performed according to the methods described herein. In some examples, aspects of the operations of 905 may be performed by a desired logic state component 640 as described with reference to FIG. 6.

At 910, the memory controller may identify a current logic state of the self-selecting memory cell. The operations of 910 may be performed according to the methods described herein. In some examples, aspects of the operations of 910 may be performed by a current logic state component 645 as described with reference to FIG. 6.

At 915, the memory controller may select a programming pulse based on the desired logic state and the current logic state. The operations of 915 may be performed according to the methods described herein. In some examples, aspects of the operations of 915 may be performed by a pulse component 615 as described with reference to FIG. 6.

At 920, the memory controller may select one or more parameters associated with the programming pulse based on the desired logic state and the current logic state of the self-selecting memory cell. In some cases, applying the programming pulse to the self-selecting memory cell is based on selecting the one or more parameters associated with the programming pulse. In some cases, the one or more parameters includes a polarity of the programming pulse, an amplitude of the programming pulse, an energy of the programming pulse, a duration of the programming pulse, a shape of the programming pulse, or a combination thereof. The operations of 920 may be performed according to the methods described herein. In some examples, aspects of the operations of 920 may be performed by a parameters component 635 as described with reference to FIG. 6.

At 925, the memory controller may apply the programming pulse with a selected polarity and a selected amplitude to the self-selecting memory cell to program the self-selecting memory cell with the desired logic state. The operations of 925 may be performed according to the methods described herein. In some examples, aspects of the operations of 930 may be performed by a pulse component 615 as described with reference to FIG. 6.

At 930, the memory controller may store the desired logic state in the self-selecting memory cell based on applying the programming pulse. The operations of 930 may be performed according to the methods described herein. In some examples, aspects of the operations of 930 may be performed by a storing component 620 as described with reference to FIG. 6.

It should be noted that the methods described above describe possible implementations, and that the operations and the steps may be rearranged or otherwise modified and that other implementations are possible. Further, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refers to a relationship between components that supports electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping of the semiconductor substrate may be performed during the initial formation or growth of the substrate, by ion-implantation, or by any other doping means.

Chalcogenide materials may be materials or alloys that include at least one of the elements sulfur (S), selenium (Se), and tellurium (Te). Phase change materials discussed herein may be chalcogenide materials. Chalcogenide materials and alloys may include, but not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

As described herein, in addition to the above-described doping of the semiconductor substrate, the chalcogenide material in a memory cell may be doped with a dopant that affects the etching rate of the memory cell during a subsequent etching step. In some examples, the chalcogenide material in a memory cell may be doped with a dopant in a manner that does not substantially alter the conductivity of the memory cell. For example, the chalcogenide material may be doped with indium at a concentration that does not substantially affect the migration of ions within the chalcogenide material.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   identifying a desired logic state for a self-selecting memory cell that is configured to store more than two logic states;
   performing a read operation to determine a first logic state of the self-selecting memory cell;
   selecting a programming pulse based at least in part on the desired logic state and the first logic state determined by the read operation;
   applying the programming pulse to the self-selecting memory cell;
   performing a second read operation to determine a second logic state of the self-selecting memory cell;
   applying a second programming pulse to the self-selecting memory cell based at least in part on determining that the second logic state is not equal to the desired logic state, wherein an energy level of the second programming pulse is greater than an energy level of the programming pulse; and storing the desired logic state in the self-selecting memory cell based at least in part on applying the second programming pulse.

2. The method of claim 1, further comprising:
selecting one or more parameters associated with the programming pulse based at least in part on the desired logic state and the first logic state of the self-selecting memory cell, wherein applying the programming pulse to the self-selecting memory cell is based at least in part on selecting the one or more parameters associated with the programming pulse.

3. The method of claim 2, wherein the one or more parameters comprises a polarity of the programming pulse, an amplitude of the programming pulse, an energy of the programming pulse, a duration of the programming pulse, a shape of the programming pulse, or a combination thereof.

4. The method of claim 3, wherein applying the programming pulse to the self-selecting memory cell comprises:
applying the programming pulse with a selected polarity and a selected amplitude to the self-selecting memory cell to program the self-selecting memory cell with the desired logic state.

5. The method of claim 1, wherein the desired logic state represents at least two bits of digital data.

6. The method of claim 1, wherein the programming pulse is a square pulse, a rectangular pulse, a ramp pulse, or a combination thereof.

7. The method of claim 1, wherein a memory component of the self-selecting memory cell comprises a tapered profile.

8. The method of claim 7, wherein the memory component of the self-selecting memory cell includes a bottom surface having a first surface area and a top surface having a second surface area positioned opposite the bottom surface, the first surface area being different than the second surface area.

9. The method of claim 1, wherein the self-selecting memory cell comprises a chalcogenide material.

10. The method of claim 1, wherein one or more first parameters associated with the read operation are different from one or more second parameters associated with the second read operation.

11. A memory apparatus, comprising:
a word line;
a bit line;
a self-selecting memory cell that is configured to store more than two logic states; and
a controller operable to:
identify a desired logic state for the self-selecting memory cell that is configured to store the more than two logic states;
perform a read operation to determine a first logic state of the self-selecting memory cell;
select a programming pulse based at least in part on the desired logic state and the first logic state determined by the read operation;
apply the programming pulse to the self-selecting memory cell;
perform a second read operation to determine a second logic state of the self-selecting memory cell;
apply a second programming pulse to the self-selecting memory cell based at least in part on determining that the second logic state is not equal to the desired logic state, wherein an energy level of the second programming pulse is greater than an energy level of the programming pulse; and
store the desired logic state in the self-selecting memory cell based at least in part on applying the second programming pulse.

12. The memory apparatus of claim 11, wherein the controller is further operable to:
select one or more parameters associated with the programming pulse based at least in part on the desired logic state and the first logic state of the self-selecting memory cell, wherein applying the programming pulse to the self-selecting memory cell is based at least in part on selecting the one or more parameters associated with the programming pulse.

13. The memory apparatus of claim 12, wherein the one or more parameters comprises a polarity of the programming pulse, an amplitude of the programming pulse, an energy of the programming pulse, a duration of the programming pulse, a shape of the programming pulse, or a combination thereof.

14. The memory apparatus of claim 13, wherein the controller is further operable to:
apply the programming pulse with a selected polarity and a selected amplitude to the self-selecting memory cell to program the self-selecting memory cell with the desired logic state.

15. The memory apparatus of claim 11, wherein the desired logic state represents at least two bits of digital data.

16. The memory apparatus of claim 11, wherein the programming pulse is a square pulse, a rectangular pulse, a ramp pulse, or a combination thereof.

17. The memory apparatus of claim 11, wherein a memory component of the self-selecting memory cell comprises a tapered profile.

18. The memory apparatus of claim 17, wherein the memory component of the self-selecting memory cell includes a bottom surface having a first surface area and a top surface having a second surface area positioned opposite the bottom surface, the first surface area being different than the second surface area.

19. The memory apparatus of claim 11, wherein the self-selecting memory cell comprises a chalcogenide material.

20. The memory apparatus of claim 11, wherein one or more first parameters associated with the read operation are different from one or more second parameters associated with the second read operation.

* * * * *